(12) United States Patent
Fujii

(10) Patent No.: US 7,667,295 B2
(45) Date of Patent: Feb. 23, 2010

(54) SEMICONDUCTOR DEVICE

(75) Inventor: Hiroki Fujii, Kanagawa (JP)

(73) Assignee: NEC Electronics Corporation, Kawasaki, Kanagawa (JP)

(*) Notice: Subject to any disclaimer, the term of this patent is extended or adjusted under 35 U.S.C. 154(b) by 0 days.

(21) Appl. No.: 12/153,345

(22) Filed: May 16, 2008

(65) Prior Publication Data

US 2008/0283967 A1    Nov. 20, 2008

(30) Foreign Application Priority Data

May 18, 2007    (JP)    .............................. 2007-133379

(51) Int. Cl.
*H01L 29/73* (2006.01)
*H01L 29/735* (2006.01)

(52) U.S. Cl. .............................. 257/592; 257/E21.375; 257/E29.044; 257/E29.187; 257/552; 257/565

(58) Field of Classification Search ................ 257/592, 257/E21.375, E29.187, E29.044, 565, 552, 257/273, 917, 927; 438/204, 205, 313, 316, 438/322, 325, 327, 334–336
See application file for complete search history.

(56) References Cited

U.S. PATENT DOCUMENTS 5,786,622 A * 7/1998 Ronkainen .................. 257/578

FOREIGN PATENT DOCUMENTS

| JP | 2-102541 | 4/1990 |
|---|---|---|
| JP | 2002-26161 | 1/2002 |
| JP | 2003-224252 | 8/2003 |

* cited by examiner

*Primary Examiner*—Lynne A. Gurley
*Assistant Examiner*—Naima J Kearney
(74) *Attorney, Agent, or Firm*—McGinn IP Law Group, PLLC

(57) ABSTRACT

In a semiconductor device including a bipolar transistor, a base region has a two layer structure including a first base region, and a second base region which is provided around the first base region and has a lower impurity density than that of the first base region and has a shallower depth than that of the first base region.

18 Claims, 8 Drawing Sheets

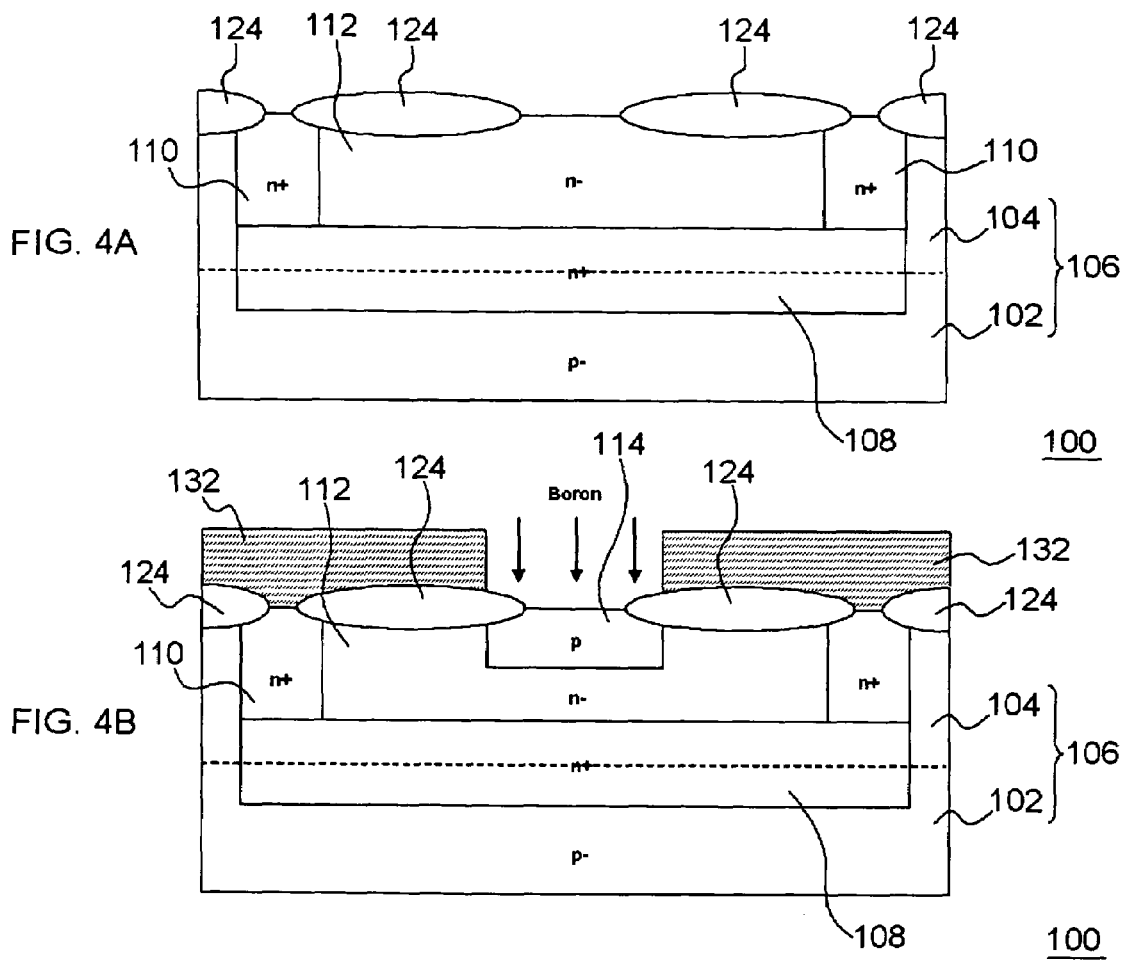

RELATED ART

SEMICONDUCTOR DEVICE

This application is based on Japanese patent application NO. 2007-133,379, the content of which is incorporated hereinto by reference.

BACKGROUND

1. Technical Field

The present invention relates to a semiconductor device including a bipolar transistor.

2. Related Art

FIG. 8 shows a configuration of a semiconductor device 200 of a conventional bipolar transistor.

The semiconductor device 200 includes: a semiconductor layer 206 including a p⁻ type semiconductor substrate 202 and an n⁻ type epitaxial layer 204; an n⁺ type impurity buried layer 208 provided between the semiconductor substrate 202 and the epitaxial layer 204; an n⁺ type sinker 210 which is connected to the impurity buried layer 208, and is provided on the surface of the semiconductor layer 206; an n⁻ type deep well 212 which is formed on the surface of the semiconductor layer 206 in a region enclosed by the sinker 210; a p type base region 214 formed in the deep well 212; a p⁺ type base extraction region 218 and an n⁺ type emitter region 220, which are formed in the base region 214; and an n⁺ type collector extraction region 222 formed in the sinker 210.

In the bipolar transistor, a breakdown is caused and a current flows (dashed line (OFF) in the drawing) into the base extraction region 218 from the collector extraction region 222 through the deep well 212 on the surfaces of the semiconductor layer 206 and the base region 214, when a voltage is applied to the collector and the collector voltage reaches a avalanche breakdown voltage between the collector and the bases in the bipolar transistor. When the above current is increased, a potential just under the emitter region is increased by a component of a (current×resistance), based on a resistance component in the base region. A junction between the emitter and the base is turned on by the above increased potential, and current flows from the base to the emitter. Thereby, the bipolar transistor is operated, and a current flows (dashed line (ON) in the drawing) from the collector extraction region 222 to the emitter region 220 through the sinker 210, the impurity buried layer 208, the deep well 212, and the base region 214.

A bipolar transistor having the above configuration has been described in Japanese Laid-Open patent Application publication NO. 2003-224252, Japanese Laid-Open patent publication NO. 2002-26161, and Japanese Laid-Open patent publication NO. H02-102541.

The present inventor has recognized as follows. It has been difficult in a conventional structure to raise an off-breakdown-voltage to, for example, a voltage exceeding 100 V. The reason is that it is required to increase the density of the base region 214 in order to prevent punch-through between the emitter and the collector, and to raise the off-breakdown-voltage, though the increase of the density of the base region 214 reduces the avalanche voltage. Moreover, a conventional structure has had a problem that the characteristics of a bipolar transistor are changed when the bipolar transistor is used for a long time. The reason is that a breakdown is generated comparatively near the surface of a substrate.

SUMMARY

In one embodiment, there is provided a semiconductor device having a bipolar transistor which includes:

a semiconductor layer;

a first-conductive-type deep well formed on the surface of the semiconductor layer;

a second-conductive-type first base region which is formed on the surface of the semiconductor layer, and, at the same time, in the deep well;

a first-conductive-type emitter region which is formed on the surface of the semiconductor layer, and, at the same time, in the base region;

a first-conductive-type collector extraction region which is provided apart from the first base region on the surface of the semiconductor layer; and a second-conductive-type second base region which is formed in the deep well, is provided between the first base region and the collector extraction region on the surface of the semiconductor layer in a state in which the second-conductive-type second base region is connected to the first base region, and has a lower impurity density than that of the first base region and a shallower depth than that of the first base region.

Thus, the base region has a two layer structure including the first base region with a high impurity density and the second base region which has a low impurity density and surrounds the first base region. So even when the impurity density of the first base region is made higher not to generate the punch-through between the collector and the emitter (between C and E), the second base region can be selectively depleted when a predetermined voltage is applied to the collector. Accordingly, the avalanche breakdown voltage can be increased by increasing a breakdown voltage between the base and the collector (between B and C) to raise the breakdown voltage.

Moreover, as the depth of the second base region is shallower than that of the first base region, the second base region is more easily depleted in a complete manner when a voltage is applied to the collector. Thereby, the avalanche voltage between the base and the collector can be further increased.

According to the present invention, a breakdown voltage can be improved in a semiconductor device including a bipolar transistor.

BRIEF DESCRIPTION OF THE DRAWINGS

The above and other objects, advantages and features of the present invention will be more apparent from the following description of certain preferred embodiments taken in conjunction with the accompanying drawings, in which:

FIGS. 4A and 4B are process cross-sectional views showing a manufacturing procedure for a semiconductor device according to the present invention;

DETAILED DESCRIPTION

Figure 1:
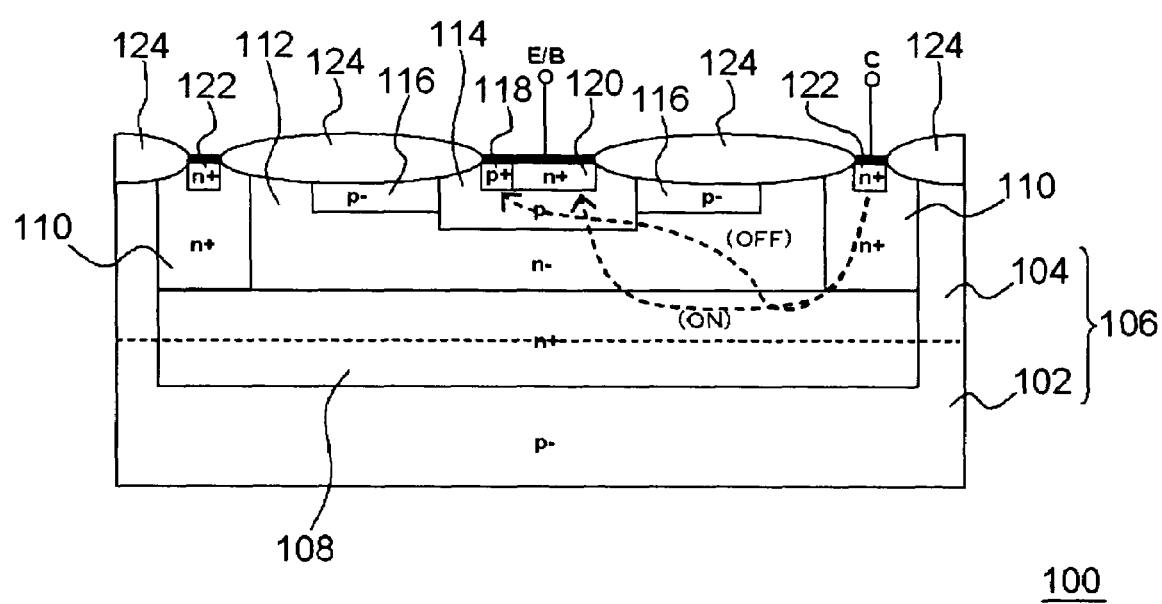
FIG. 1 is a cross-sectional view showing a configuration of a semiconductor device according to the present invention.

The invention will be now described herein with reference to illustrative embodiments. Those skilled in the art will recognize that many alternative embodiments can be accompanied using the teachings of the present invention and that the invention is not limited to the embodiments illustrated for explanatory purposes.

Hereinafter, an embodiment according to the present invention will be explained with reference to drawings. Here, similar components will be denoted by the same reference numerals all in the drawings, and explanation will not be repeated.

In the present embodiment, the semiconductor device is a high breakdown voltage bipolar transistor for ESD protection. In the following embodiments, examples will be explained, assuming that the first conductive type is an N type, and the second conductive type is a P type.

Figure 2:
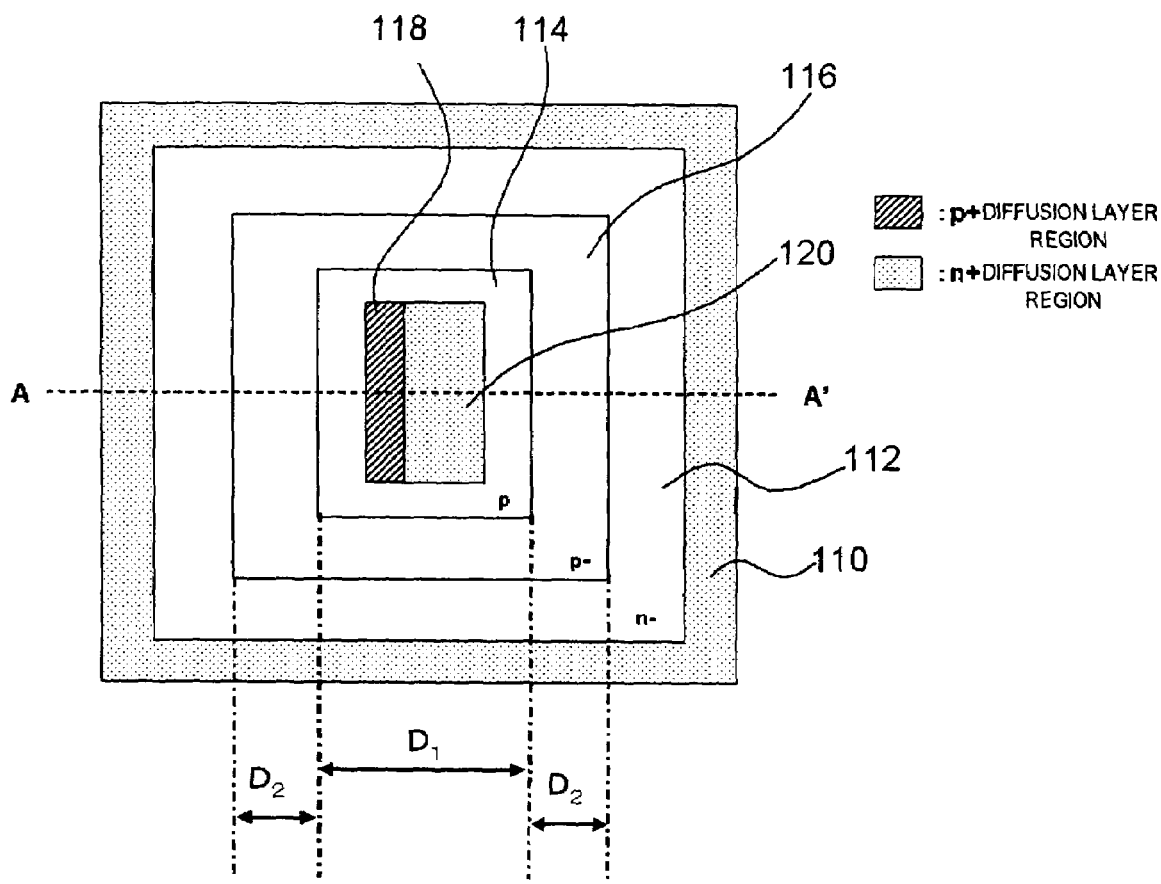
FIG. 2 is an upper plan view showing the configuration of the semiconductor device according to the present invention.

FIG. 1 and FIG. 2 are views showing a configuration of the semiconductor device according to the present embodiment. FIG. 2 is an upper plan view showing a semiconductor device 100, and FIG. 1 is a cross sectional view taken along the A-A' line in FIG. 2.

The semiconductor device 100 includes a semiconductor layer 106 formed with a second-conductive-type (p$^-$) semiconductor substrate 102, and a first conductive-type (n$^-$) epitaxial layer 104 formed on the semiconductor substrate 102. The semiconductor device 100 further includes: a first conductive-type (n$^+$) emitter region 120 formed on the surfaces of the semiconductor layer 106; a second-conductive-type (p$^+$) base extraction region 118; a second-conductive-type (p) first base region 114; a second-conductive-type (p$^-$) second base region 116; a first conductive-type (n$^-$) deep well 112; and a first conductive-type (n$^+$) collector extraction region 122 which is provided apart from the first base region 114 and, at the same time, has a higher impurity density than that of the deep well 112.

The semiconductor device 100 further includes: a first conductive-type (n$^+$) impurity buried layer 108 which is formed between the semiconductor substrate 102 below the deep well 112 and the epitaxial layer 104, and has a impurity density higher than that of the deep well 112; a first conductive-type (n$^+$) sinker 110 which is formed around the collector extraction region 122, and has a higher impurity density than that of the deep well 112; and an element separation insulating film 124 which is formed on the semiconductor layer 106, and separates the first base region 114 and the collector extraction region 122.

In the present embodiment, the second base region 116 is provided between the first base region 114 and the collector extraction region 122 on the surfaces of the semiconductor layer 106 in the deep well 112 in a state in which the region 116 is connected to the first base region 114. The second base region 116 is formed in such a way that the impurity density of the region 116 is lower than that of the first base region 114. Here, as the base extraction region 118 and the emitter region 120 are formed in the first base region 114, the second base region 116 can be configured to be formed underneath the element separation insulating film 124. Furthermore, the depth of the second base region 116 can be configured to be shallower than that of the first base region 114 in the present embodiment.

The second base region 116 is acceptably configured to be depleted in an easier way than that of the first base region 114, and the density, the depth, and the width of the second base region 116 are designed in such a way that a required avalanche breakdown voltage is realized. That is, the second base region 116 is configured to be completely depleted by first conductive-type impurities in the deep well 112 when a predetermined voltage equal to, or lower than the avalanche breakdown voltage of the bipolar transistor is applied to the collector extraction region 122. For example, a horizontal width D$_2$ of the second base region 116 can be configured to be about 3 μm to about 8 μm.

On the other hand, the density of the first base region 114 is designed to prevent punch through between C and E. Here, the width D$_1$ of the first base region 114 can be configured to be about 3 μm to 8 μm.

Then, the operation of the semiconductor device 100 according to the present embodiment will be explained. When a voltage is applied to the collector (the collector extraction region 122) in the first place, depletion is advanced from the lower side and the side of the second base region 116, and the second base region 116 is completely depleted at a comparatively low voltage. When it is assumed, for example, that the density of the second base region 116 is 3×10$^{16}$ cm$^{-3}$, the depth of the second base region 116 is 1 μm, the density of the deep well 112 is 3×10$^{16}$ cm$^{-3}$, the second base region 116 is completely depleted at about 45 V, using the following expressions.

$$W = \{2 \times \epsilon_0 \times \epsilon_r \times (V_0 - V) \times (1/N_a + 1/N_d)/q\}^{1/2}$$

$$V_0 = (k \times T/q) \times ln(N_a \times N_d/n_i^2)$$

W: Width of depletion layer
$\epsilon_0$: Dielectric constant in vacuum
$\epsilon_r$: Specific dielectric constant of Silicon
$V_0$: Pn contact potential difference at 0 bias
V: Applied voltage
$N_a$: p-type impurity density
$N_d$: n-type impurity density
q: Electron charge amount
k: Boltzman's constant
T: Temperature
$n_i$: Density of intrinsic carrier.

The impurity density of the deep well 112 is higher near the surface of the semiconductor layer 106 than that of the inside. Accordingly, the avalanche breakdown voltage between B and C is decided in the P-N joint portion near the surfaces of the semiconductor layer 106. Accordingly, a depletion layer can be formed on the surface of the semiconductor layer 106 by providing the second base region 116, the density of which is lower than that of the first base region 114, around the first base region 114 on the surface of the semiconductor layer 106, and the avalanche breakdown voltage between B and C can be increased. Moreover, when the depth of the second base region 116 is formed shallower than that of the first base region 114, the second base region 116 is more easily depleted in a completed manner when a voltage is applied to the collector. Thereby, the avalanche breakdown voltage between B and C can be further increased.

When the voltage applied to the collector reaches the avalanche breakdown voltage between the collector and the base, the breakdown is caused. At this time, a current between the collector extraction region 122 and the base extraction region 118 flows not through the surface of the semiconductor layer 106, but through the sinker 110, the impurity buried layer 108, and the deep well 112 (dashed line (OFF)) in the drawing) as shown in FIG. 1.

When the current is increased, the potential just under the emitter region 120 is increased by a (current×resistance) component, based on the resistance component of the first base region 114. A junction between the emitter and the base is turned on by the above potential, and current flows from the base extraction region 118 to the emitter region 120. Thereby, the bipolar transistor works, and a current flows from the collector extraction region 122 to the emitter region 120 through the sinker 110, the impurity buried layer 108, the deep well 112, and the first base region 114 (dashed line (ON) in the drawing).

According to the semiconductor device 100 in the present embodiment, the second base region 116 is completely depleted when a voltage is applied to the collector. Therefore, the avalanche breakdown voltage between B and C can be increased, and, at the same time, the density of the first base region 114 can be kept high. Accordingly, the punchthrough between C and E can be prevented to obtain a high off-breakdown-voltage exceeding 100 V. Moreover, as the avalanche breakdown voltage between B and C can be decided by the width of the second base region 116 in the horizontal direction, an off-breakdown-voltage can be adjusted only by layout adjustment. Moreover, as the avalanche breakdown is caused not on the surfaces of the semiconductor layer 106, but in the inside, the characteristics of a bipolar transistor can be hardly changed even when the bipolar transistor is operated for a long time.

Then, a manufacturing procedure of the semiconductor device 100 in the present embodiment will be explained. FIG. 3A to FIG. 5B are process cross-sectional views showing a manufacturing procedure of the semiconductor device 100 according to the present embodiment.

Figure 3A:
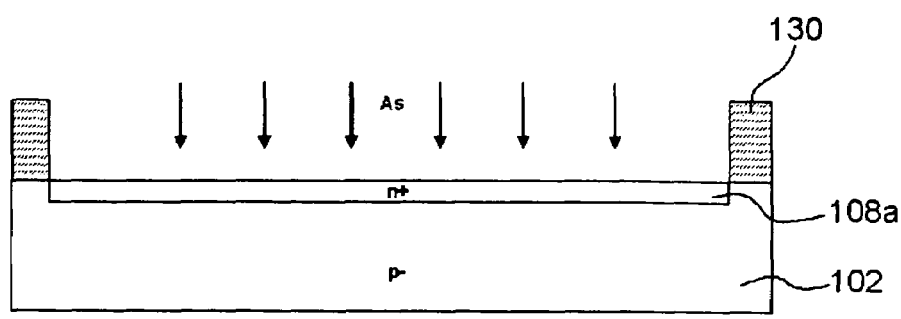
FIGS. 3A and 3B are process cross-sectional views showing a manufacturing procedure for the semiconductor device according to the present invention.

In the first place, a first protection film 130 with an opening having a predetermined region is formed on the P-type semiconductor substrate 102, and As is introduced into the semiconductor substrate 102, using the first protection film 130 as a mask, to form a first impurity implantation region 108*a* (FIG. 3A). Here, the predetermined region can be defined as the whole surface (BJT region) of a region in which the deep well 112 and the sinker 110 are formed. Conditions for As introducing can be assumed as, for example, 50 keV to 100 keV, and $5 \times 10^{13}$ cm$^{-2}$ to $5 \times 10^{15}$ cm$^{-2}$ (5e13 cm$^{-2}$ to 5e15 cm$^{-2}$). The first protection film 130 can be assumed as, for example, a silicon oxide film. Thereafter, the first protection film 130 is removed.

Figure 3B:
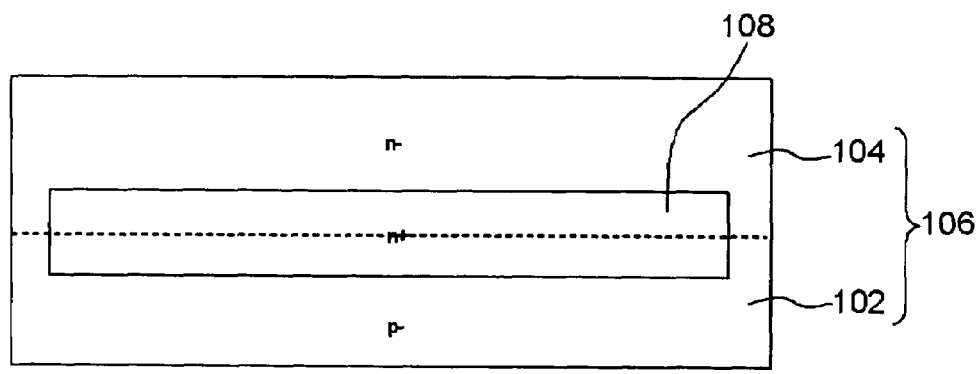

Subsequently, heat at around 1100° C. is added to form the N-type epitaxial layer 104 (for example, 5 μm to 10 μm in film thickness) on the semiconductor substrate 102. Here, the density of the N type impurity ion in the epitaxial layer 104 can be configured to be, for example, $1 \times 10^{15}$ cm$^{-2}$ to $1 \times 10^{16}$ cm$^{-2}$ (1e15 cm$^{-2}$ to 1e16 cm$^{-2}$). Thereby, the semiconductor layer 106 is formed (FIG. 3B)

By the added heat at this time, the above epitaxial layer 104 grows, and, at the same time, As in the first impurity implantation region 108*a* diffuses to form the impurity buried layer 108 between the semiconductor substrate 102 and the epitaxial layer 104.

Then, the element separation insulating film 124 (LOCOS) is selectively formed on the surface of the semiconductor layer 106. Subsequently, the sinker 110 is formed (FIG. 4A) by using a predetermined mask, and by introducing N-type impurities. The sinker 110 can be formed by introducing P. Conditions for introducing P can be assumed to be, for example, 50 keV to 100 keV, and $5 \times 10^{13}$ cm$^{-2}$ to $5 \times 10^{15}$ cm$^{-2}$ (5e13 cm$^{-2}$ to 5e15 cm$^{-2}$). Thereafter, heat-treating at a temperature exceeding 1000° C. is performed for about one hour to three hours to diffuse impurities, and to connect the sinker 110 and the impurity buried layer 108.

Subsequently, the first base region 114 (about 1.0 μm to 1.5 μm in depth) is formed (FIG. 4B) by introducing P-type impurities onto the surface of the semiconductor layer 106, using a second protection film 132 provided with an opening portion having a predetermined pattern. The first base region 114 can be formed by introducing boron. The impurity density of the first base region 114 can be configured to be, for example, $1 \times 10^{17}$ cm$^{-3}$ to $5 \times 10^{17}$ cm$^{-3}$ (1e17 cm$^{-3}$ to 5e17 cm$^{-3}$).

Thereafter, the second base region 116 (about 0.4 μm to 0.8 μm) (FIG. 5A) is formed by introducing P-type impurities onto the surface of the epitaxial layer 104 by use of a third protection film 134 with an opening portion with a width larger than that of the second protection film 132. The second base region 116 can be formed by introducing boron. The impurity density of the second base region 116 can be configured to be, for example, $1 \times 10^{16}$ cm$^{-3}$ to $1 \times 10^{17}$ cm$^{-3}$ (1e16 cm$^{-3}$ to 5e16 cm$^{-3}$). As boron is also introduced into the first base region 114 at this time, the impurity density in the region 114 becomes a density reflecting the density of the impurity ions introduced at the introducing processes shown in FIG. 4B and in FIG. 5A. Moreover, the opening width of the third protection film 134 is set in such a way that the width of the second base region 116 ($D_2$ in FIG. 2) is a width realizing a desired breakdown voltage wherein the second base region 116 is formed according to the opening width of the second protection film 132.

Figures 5A, 5B:
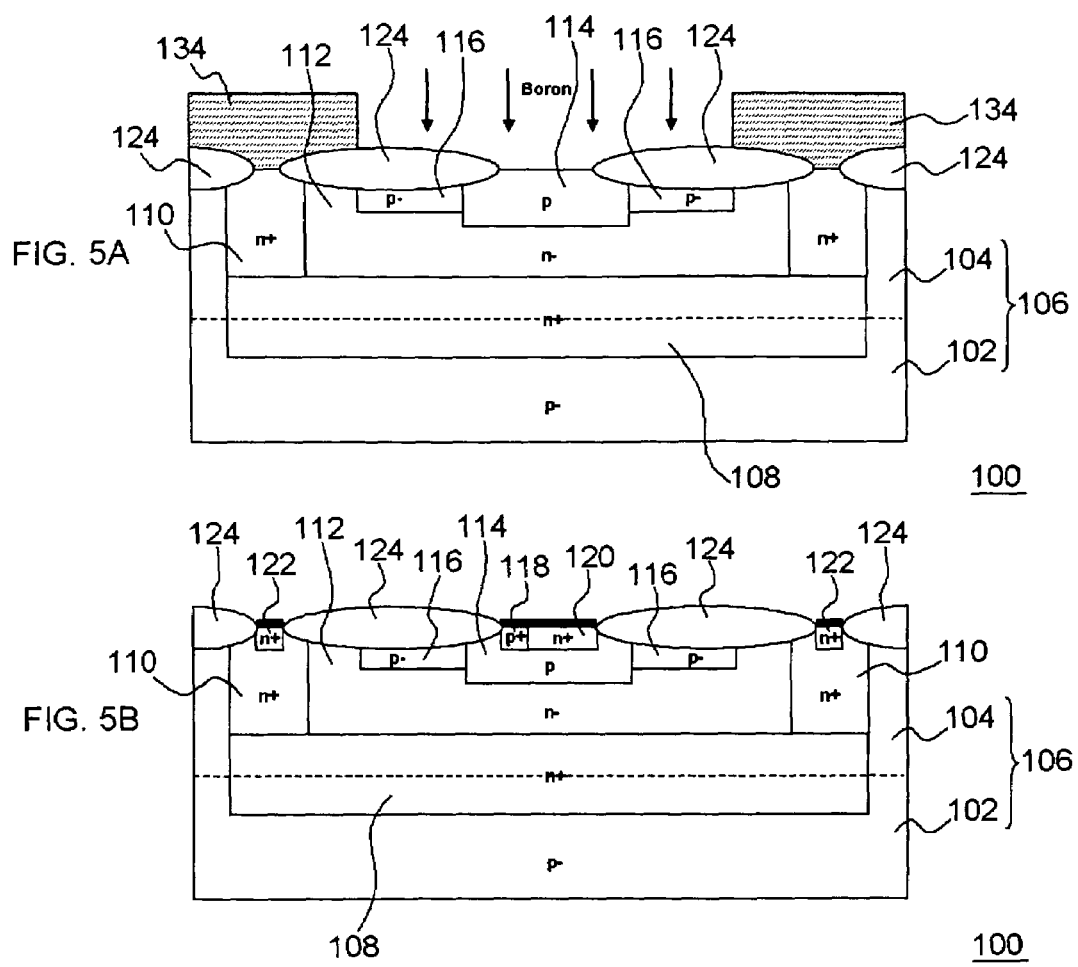
FIGS. 5A and 5B are process cross-sectional views showing a manufacturing procedure for a semiconductor device according to the present invention.

Hereafter, N-type impurities are introduced onto the surface of the semiconductor layer 106, using a mask with a predetermined pattern, to form the emitter region 120 in the first base region 114, and the collector extraction region 122 in the sinker 110, respectively. Moreover, P-type impurities are introduced onto the surface of the semiconductor layer 106, using a mask with a predetermined pattern, to form the base extraction region 118 in the first base region 114 (FIG. 5B). Thereby, the semiconductor device 100 with a similar configuration to that shown in FIG. 1 can be obtained.

Figure 6:
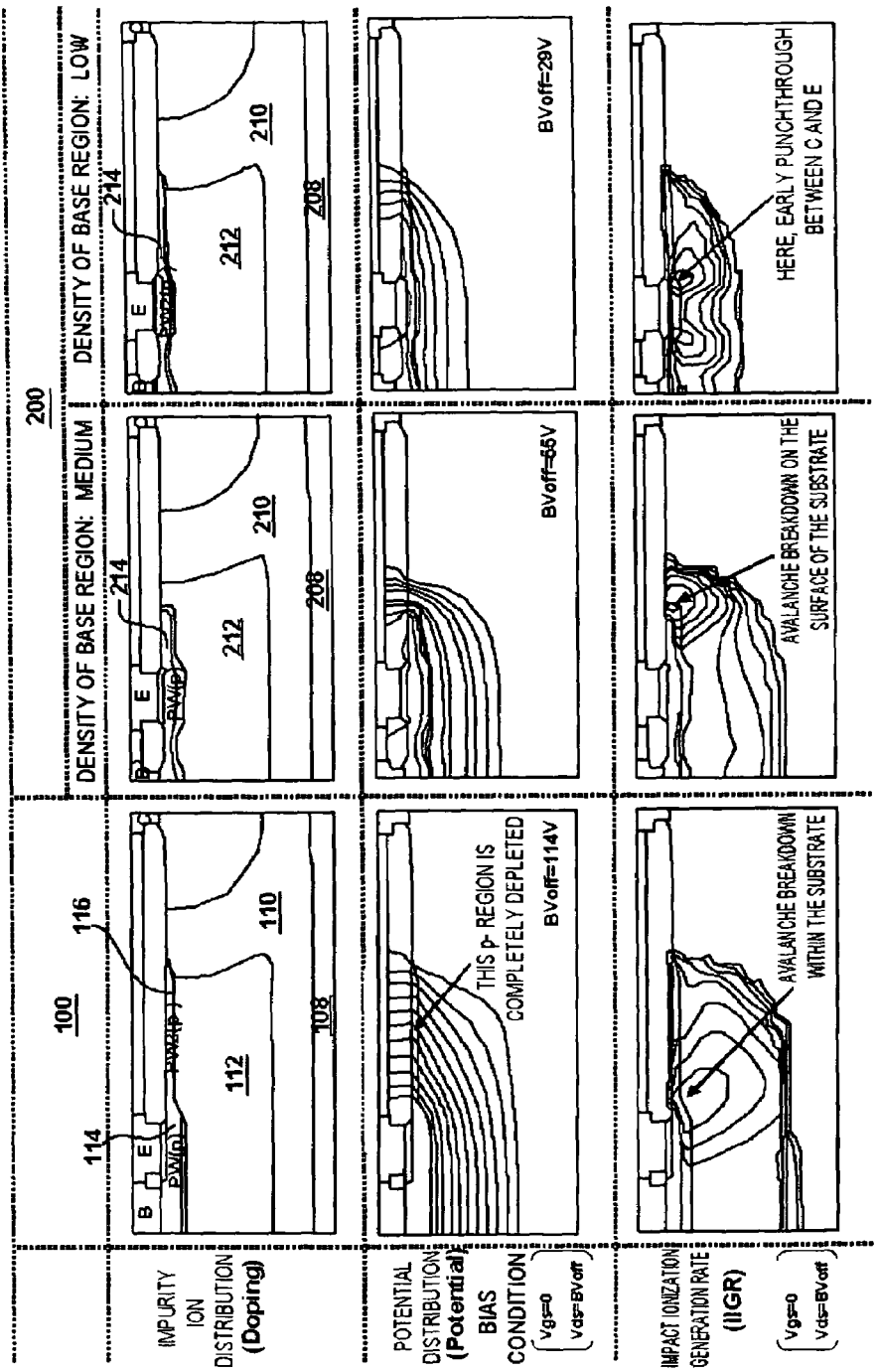
FIG. 6 is a view showing a state of an electric potential distribution for the semiconductor device in the present embodiment shown in FIG. 1, and that for the conventional semiconductor device shown in FIG. 8.
Figure 8:
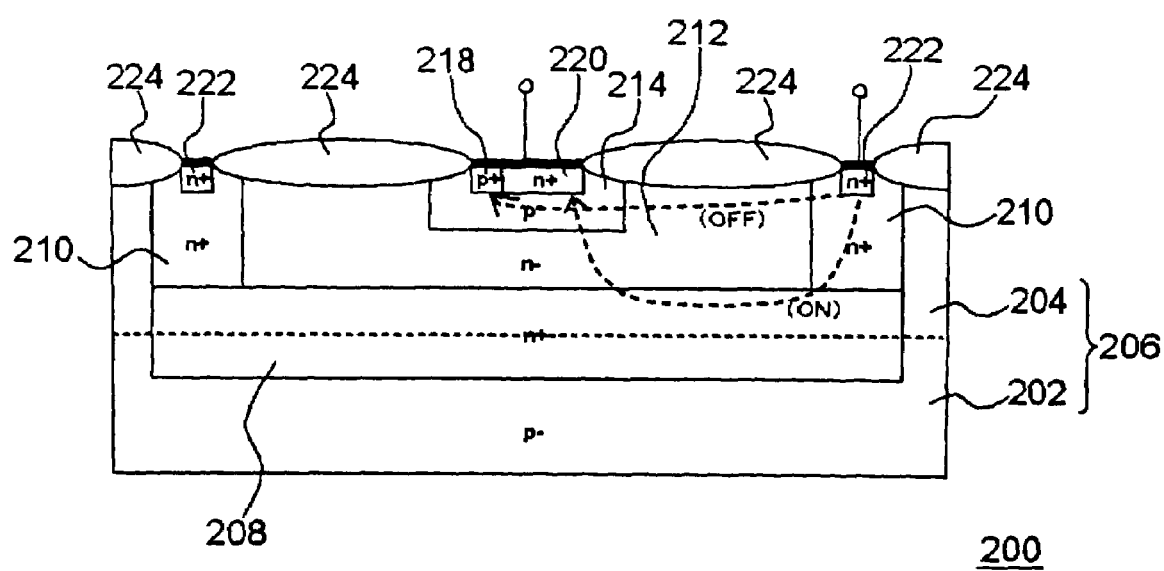
FIG. 8 is a cross-sectional view showing the configuration of a conventional semiconductor device.

FIG. 6 is a view showing a state of an electric potential distribution for the semiconductor device 100 in the present embodiment shown in FIG. 1, and that for the conventional semiconductor device 200 shown in FIG. 8. Here, there are shown an impurity ion distribution (upper portion in the drawing), an impact-ionization generation rate distribution at breakdown (lower portion in the drawing), and a potential distribution (middle portion in the drawing). Here, there have been executed simulations for the semiconductor device 200, including a case (density of the base region: medium) in which the impurity density of the base region 214 is almost the same as that of the first base region 114 in the semiconductor device 100, and a case (density of the base region: low) in which the impurity density of the base region 214 is almost the same as that of the second base region 116 in the base region 214.

As seen in the drawing for the impurity ion distribution, there is provided the second base region 116 around the first base region 114 in the semiconductor device 100, wherein the impurity density of the region 116 is lower than that of the first base region 114. Moreover, as seen from the electric potential distribution, it is found in the semiconductor device 100 shown in the left side that equipotential lines are uniformly distributed in the portion of the second base region 116, and the portion is depleted.

Moreover, it is found in the impact ionization generation rate distribution drawing that avalanche breakdown has been caused in the inside of the substrate of the semiconductor device 100. On the other hand, when the density of the base region 214 is medium, avalanche breakdown is caused on the substrate surface portion at the side end portion of the collector extraction region 222 in the base region 214 in the semiconductor device 200. When the density of the base region 214 in the semiconductor device 200 is low, the punchthrough is caused in a region just under the emitter region 220.

Moreover, when the density of the base region 214 is medium, the breakdown voltage was about 55 V, and, when the density of the base region 214 is low, the breakdown voltage was about 29 V in the semiconductor device 200. On the other hand, the breakdown voltage could be increased to 114 V in the semiconductor device 100.

As described above, the present invention has been explained, based on the embodiments. It will be appreciated by persons skilled in the art that the above embodiments are illustrative, combinations of the above various kinds of components and various processes may be changed, and the above modifications fall within the scope of the present invention.

The above-described examples have shown a configuration in which the N-type epitaxial layer 104 is formed on the semiconductor substrate 102. However, there is provided another example in which the P-type epitaxial layer can be formed on the semiconductor substrate 102 and, thereafter, the deep well 112 can be also formed by ion introducing of N-type impurity ions.

Figure 7:
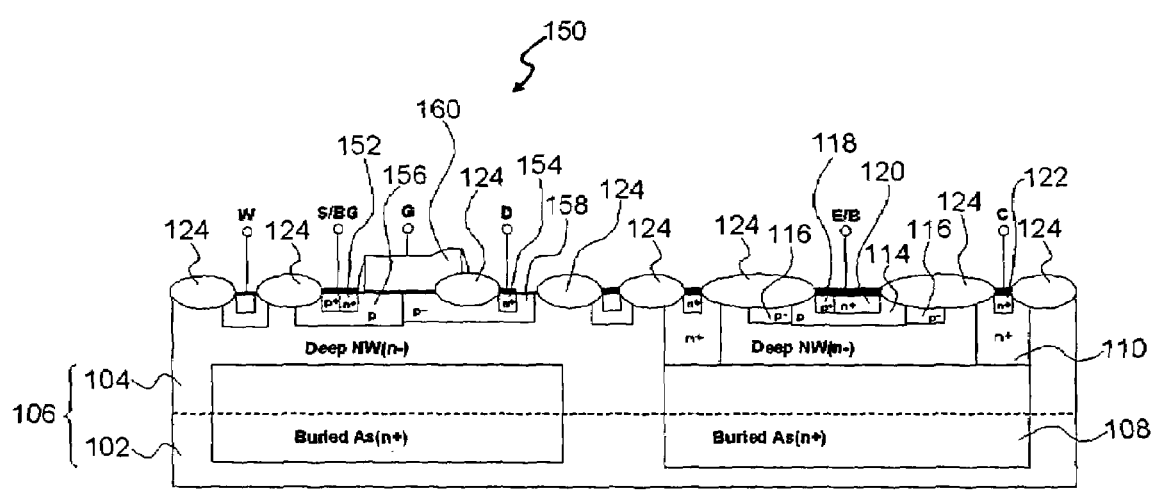
FIG. 7 is a view showing a configuration in which a bipolar transistor and a MOS transistor shown in FIG. 1 are formed in a semiconductor layer.

FIG. 7 is a view showing a configuration in which the bipolar transistor shown in FIG. 1 and a MOS transistor 150 are formed on the semiconductor layer 106. The MOS transistor 150 includes a source region 152 and a drain region 154, which are formed on the surface of the semiconductor layer 106, a first channel region 156 formed around the source region 152, a second channel region 158 which is formed around the drain region 154, and in which the impurity density is lower than that of the first channel region 156, and a gate electrode 160 which is formed on the semiconductor layer 106 in a region between the source region 152 and the drain region 154. The MOS transistor 150 has a so-called RESURF structure using depleting of PN joint in order to realize a high breakdown voltage and a low on-resistance.

A buried layer similar to the impurity buried layer 108 is formed in the lower portion of the MOS transistor 150. Moreover, a deep well region (deep NW (n⁻)) underneath the second channel region 158 is formed in a similar manner to that of the deep well 112. According to the above configuration, the second base region 116 can be completely depleted under the same condition as that for complete depletion of the second channel region 158 in the MOS transistor 150. Thereby, the second channel region 158 and the second base region 116 are grouped and depleted at the same time. When the semiconductor device 100 and the MOS transistor having the RESURF structure are combined, the second base region 116 can be formed without adding a new process.

It is apparent that the present invention is not limited to the above embodiments, and may be modified and changed without departing from the scope and the sprit of the invention.

What is claimed is:

1. A semiconductor device including a bipolar transistor, comprising:
   a semiconductor layer;
   a first-conductive-type deep well formed on a surface of the semiconductor layer;
   a second-conductive-type first base region formed on the surface of the semiconductor layer and formed in the deep well;
   a first-conductive-type collector extraction region provided apart from the first base region on the surface of the semiconductor;
   a second-conductive-type second base region formed in the deep well and provided between the first base region and the collector extraction region on the surface of the semiconductor layer; and
   an element separation insulating layer formed between the collector extraction region and the first base region, and formed on the second base region,
   wherein the second base region is connected to the first base region, and having an impurity concentration lower than an impurity concentration in the first base region, and
   wherein the second base region is shallower than the first base region.

2. The semiconductor device according to claim 1, wherein the second base region is provided under the element separation insulating layer.

3. The semiconductor device according to claim 2, wherein the second base region contacts the element separation insulating layer.

4. A semiconductor device, comprising:
   an impurity buried layer;
   a first-conductive-type deep well formed on a surface of the impurity buried layer;
   a second-conductive-type first base region formed in the deep well;
   a first-conductive-type emitter region formed on a surface of the first base region;
   a first-conductive-type collector extraction region provided apart from the first base region;
   a second-conductive-type second base region, formed in the deep well, provided between the first base region and the collector extraction region, the second base region being shallower than the first base region inside the deep well; and
   an element separation insulating layer formed on the second base region,
   wherein the impurity buried layer comprises an impurity density higher than an impurity density of the deep well, and
   wherein an impurity density of the second base region is lower than an impurity density of the first base region.

5. The semiconductor device according to claim 4, wherein the element separation insulating layer is provided between the first base region and the collector extraction region.

6. The semiconductor device according to claim 5, wherein the impurity density of the deep well is lower than the impurity density of the impurity buried layer.

7. The semiconductor device according to claim 6, further comprising a first-conductive-type sinker formed around the collector extraction region, the sinker having an impurity density higher than the deep well.

8. The semiconductor device according to claim 5, further comprising a semiconductor layer including the impurity buried layer, the deep well, the first base region, the emitter region, the collector extraction region, and the second base region.

9. The semiconductor device according to claim 8, wherein the semiconductor layer comprises:
   a semiconductor substrate; and
   a first-conductive-type epitaxial region formed over the semiconductor substrate.

10. The semiconductor device according to claim 9, wherein the deep well, the first base region, and the second base region are provided in the epitaxial region.

11. The semiconductor device according to claim 5, wherein the second base region surrounds the first base region.

12. The semiconductor device according to claim 4, wherein the second base region is completely depleted by the first-conductive-type impurities in the deep well when a predetermined voltage not more than an avalanche breakdown voltage is applied to the collector extraction region.

13. The semiconductor device according to claim 4, wherein the second base region forms a depletion region when a voltage greater than a predetermined collector voltage is applied thereto.

14. The semiconductor device according to claim 4, wherein the second base region is configured to be more easily depleted than the first base region.

15. The semiconductor device according to claim 14, wherein the second base region is configured to be completely depleted by first conductive-type impurities in the deep well when a predetermined voltage equal to or lower than an avalanche breakdown voltage of a bipolar transistor is applied to the collector extraction region.

16. The semiconductor device according to claim 4, wherein a base extraction region and an emitter region are formed in the first base region.

17. The semiconductor device according to claim 4, wherein the second base region is provided under the element separation insulating layer.

18. The semiconductor device according to claim 17, wherein the second base region contacts the element separation insulating layer.

* * * * *